US012630732B2

(12) United States Patent
Kim et al.

(10) Patent No.: US 12,630,732 B2
(45) Date of Patent: May 19, 2026

(54) SCATTERING PARTICLE, INK COMPOSITION INCLUDING THE SAME, AND DISPLAY APPARATUS INCLUDING QUANTUM DOT LAYER PREPARED BY USING THE INK COMPOSITION

(71) Applicant: Samsung Display Co., Ltd., Yongin-si (KR)

(72) Inventors: Soodong Kim, Yongin-si (KR); Sujin Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 596 days.

(21) Appl. No.: 18/306,029

(22) Filed: Apr. 24, 2023

(65) Prior Publication Data

US 2024/0059921 A1 Feb. 22, 2024

(30) Foreign Application Priority Data

Aug. 12, 2022 (KR) ........................ 10-2022-0101581

(51) Int. Cl.
*C09D 11/50* (2014.01)
*B82Y 20/00* (2011.01)
(Continued)

(52) U.S. Cl.
CPC ............ *C09D 11/50* (2013.01); *C09C 1/3661* (2013.01); *C09C 1/3669* (2013.01);
(Continued)

(58) Field of Classification Search
CPC ....... C09D 11/50; C09D 11/101; C09D 11/38; C09D 11/037; C09D 11/107; C09D 11/322; C09D 11/03; C09C 1/3661; C09C 1/3669; C09C 1/3692; C09C 1/028; C09C 1/043; C09C 1/3045; C09C 1/3063; C09C 1/309; C09C 1/36; C09C 1/407; C09C 3/006; C09C 3/066; C09C 3/08; C09C 3/063; C09K 11/621; C09K 11/56; C09K 11/883;
(Continued)

(56) References Cited

U.S. PATENT DOCUMENTS 11,407,914 B2 8/2022 Rogojina et al.
2017/0362502 A1* 12/2017 Lee ........................ H05B 33/20
(Continued)

FOREIGN PATENT DOCUMENTS

KR 10-1777596 B1 9/2017
KR 10-2019-0112646 A 10/2019
KR 10-2021-0102316 A 8/2021

OTHER PUBLICATIONS

Tatsuya Kameyama et al., Wavelength-Tunable Band-Edge Photoluminescence of Nonstoichiometric Ag—In—S Nanoparticles via $Ga^{3+}$ Doping, ACS Appl. Mater. Interfaces, 2018, pp. A-L, ACS Publications, American Chemical Society.

*Primary Examiner* — William B Partridge
*Assistant Examiner* — Chevy J Boegel
(74) *Attorney, Agent, or Firm* — Womble Bond Dickinson (US) LLP

(57) ABSTRACT

A scattering particle includes a core and a shell, wherein the shell includes a first layer including a compound capable of reacting with oxygen and/or moisture, and a second layer including a compound decomposable by light and/or heat.

20 Claims, 11 Drawing Sheets

(51) Int. Cl.

| | |
|---|---|
| ***C09C 1/36*** | (2006.01) |
| ***C09C 3/00*** | (2006.01) |
| ***C09C 3/06*** | (2006.01) |
| ***C09C 3/08*** | (2006.01) |
| ***C09D 11/037*** | (2014.01) |
| ***C09D 11/107*** | (2014.01) |
| ***C09D 11/322*** | (2014.01) |
| ***C09K 11/62*** | (2006.01) |
| ***H10K 59/38*** | (2023.01) |
| ***H10K 59/80*** | (2023.01) |

(52) U.S. Cl.
CPC ............ *C09C 1/3692* (2013.01); *C09C 3/006* (2013.01); *C09C 3/066* (2013.01); *C09C 3/08* (2013.01); *C09D 11/037* (2013.01); *C09D 11/107* (2013.01); *C09D 11/322* (2013.01); *C09K 11/621* (2013.01); *H10K 59/38* (2023.02); *H10K 59/877* (2023.02); *B82Y 20/00* (2013.01); *C01P 2004/62* (2013.01); *C01P 2004/80* (2013.01); *C01P 2006/60* (2013.01)

(58) Field of Classification Search
CPC ................. H10K 59/38; H10K 59/877; H10K 2102/331; H10K 50/11; H10K 50/15; H10K 50/16; H10K 50/17; H10K 50/18; H10K 50/81; H10K 50/82; H10K 50/844; H10K 50/854; B82Y 20/00; C01P 2004/62; C01P 2004/80; C01P 2004/64; C01P 2006/60; C01G 23/047
See application file for complete search history.

(56) References Cited

U.S. PATENT DOCUMENTS

| | | | | |
|---|---|---|---|---|
| 2020/0181437 | A1* | 6/2020 | Rogojina ............. | C09D 11/107 |
| 2022/0204845 | A1* | 6/2022 | Nojima ................ | C09K 11/883 |

* cited by examiner

SCATTERING PARTICLE, INK COMPOSITION INCLUDING THE SAME, AND DISPLAY APPARATUS INCLUDING QUANTUM DOT LAYER PREPARED BY USING THE INK COMPOSITION

CROSS-REFERENCE TO RELATED APPLICATION

This application claims priority to and the benefit of Korean Patent Application No. 10-2022-0101581, filed on Aug. 12, 2022, in the Korean Intellectual Property Office, the disclosure of which is incorporated by reference herein in its entirety.

BACKGROUND

1. Field

One or more embodiments relate to a scattering particle, an ink composition including the same, and a display apparatus including a quantum dot layer prepared by utilizing the ink composition.

2. Description of the Related Art

A display apparatus, such as an organic light-emitting display apparatus, implements an image by generating light based on the principle in which holes and electrons respectively injected from an anode and a cathode recombine in an emission layer to emit light. For example, the display apparatus includes pixels for emitting light of a color, e.g., color from among red, green, and blue, and expresses a desired or suitable color by combining colors of the pixels.

To this end, each of the pixels may include a light-emitting device that generates white light or monochromatic light, such as blue light, and a quantum dot layer and a color filter as light controllers that convert the white light or monochromatic light into a desired or suitable color from among red, green, and blue and emit the converted light. For example, when the light-emitting device of each of the pixels generates monochromatic light, the monochromatic light is converted into a color from among red, green, and blue while passing through the quantum dot layer and the color filter, and then is emitted. As such, an image of a desired or suitable color is implemented by combining appropriate or suitable colors of the light emitted by the pixels.

SUMMARY

Aspects according to one or more embodiments are directed toward a display apparatus in which quantum dot defects due to permeation of oxygen or moisture are reduced.

Additional aspects will be set forth in part in the description which follows and, in part, will be apparent from the description, or may be learned by practice of the presented embodiments of the disclosure.

According to one or more embodiments, a scattering particle includes a core and a shell, wherein the shell includes a first layer including a compound capable of reacting with oxygen and/or moisture, and a second layer including a compound decomposable by light and/or heat.

In the scattering particle, the first layer may be located between the core and the second layer.

In the scattering particle, the second layer may include a second-first layer including a compound decomposable by light and/or a second-second layer including a compound decomposable by heat.

In the scattering particle, the compound capable of reacting with oxygen and/or moisture may include a metal, a phenol-based compound, a phosphorus-based compound, a sulfur-based compound, or any combination thereof.

In the scattering particle, the compound capable of reacting with oxygen and/or moisture may include an alkali metal, an alkaline earth metal, a Group III metal, ethylenebis(oxyethylene)bis-(3-(5-tert-butyl-4-hydroxy-m-tolyl)propionate), 3,9-bis[2-[3-(3-t-butyl-4-hydroxy-5-methylphenyl)propionyloxy]-1,1-dimethylethoxy]-2,4,8,10-tetraoxaspiro[5.5]undecane, pentaerythrityl tetrakis[3-(3,5-di-t-butyl-4-hydroxyphenyl)propionate], 1,3,5,-trimethyl-2,4,6,-tris(3'5'-di-t-butyl-4-hydroxybenzyl)benzene, triethyleneglycol-bis[3-(3-t-butyl-5-methyl-4-hydroxyphenyl)propionate], 4,4'-thiobis(6-t-butyl-3-methylphenol), tris-(3,5-di-t-butyl-4-hydroxybenzyl)-isocyanurate, 1,3,5-tris(4-t-butyl-3-hydroxy-2,6-dimethylbenzyl)-isocyanurate, 1,6-hexanediol-bis[3-(3,5-di-t-butyl-4-hydroxyphenyl)propionate], 2,2-thio-diethylenebis[3-(3,5-di-t-butyl-4-hydroxyphenyl)propionate], N,N'-hexamethylenebis(3,5-di-t-butyl-4-hydroxy-hydrocinnamamide), 1,3,5-trimethyl-2,4,6-tris(3,5-di-t-butyl-4-hydroxybenzyl)benzene, 2,4-bis[(octylthio)methyl]-O-cresol, 1,6-hexanediol-bis-[3-(3,5-di-t-butyl-4-hydroxyphenyl)propionate], octadecyl-[3-(3,5-di-t-butyl-4-hydroxyphenyl)propionate], 2,2'-methylenebis(4-methyl-6-t-butylphenol), 4,4'-butylidene-bis(3-methyl-6-t-butylphenol), 1,1,3-tris(2-methyl-4-hydroxy-5-t-butylphenyl)butane, 1,3,5-tris(4-hydroxybenzyl)benzene, tetrakis[methylene-3-(3,5'-di-t-butyl-4'-hydroxyphenylpropionate)]methane, sodium hydrogen sulfite, sodium sulfite, 2,2-bis({[3-(dodecylthio)propionyl]oxy}methyl)-1,3-propanediyl-bis[3-(dodecylthio)propionate], 2-mercaptobenzimidazole, dilauryl-3,3'-thiodipropionate, dimyristyl-3,3'-thiodipropionate, distearyl-3,3'-thiodipropionate, pentaerythrityl-tetrakis(3-laurylthiopropionate), 3,9-bis(2,6-di-tert-butyl-4-methylphenoxy)-2,4,8,10-tetraoxa-3,9-diphosphaspiro[5.5]undecane, diisodecyl pentaerythritol diphosphite, bis(2,4-di-t-butylphenyl)pentaerythritol diphosphite, 2,2'-methylenebis(4,6-di-t-butyl-1-phenyloxy)(2-ethylhexyloxy)phosphorus, 6-[3-(3-t-butyl-4-hydroxy-5-methylphenyl)propoxy]-2,4,8,10-tetra-t-butyldibenz[d,f][1,3,2]dioxaphospepine, triphenyl phosphite, diphenyl isodecyl phosphite, phenyl diisodecyl phosphite, 4,4'-butylidene-bis(3-methyl-6-t-butylphenylditridecyl)phosphite, octadecyl phosphite, tris(nonylphenyl)phosphite, 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, 10-decyloxy-9,10-dihydro-9-oxa-10-phosphaphenanthrene-10-oxide, tris(2,4-di-t-butylphenyl)phosphite, cyclic neopentanetetraylbis(2,4-di-t-butylphenyl)phosphite, cyclic neopentanetetraylbis(2,6-di-t-butylphenyl)phosphite, 2,2-methylenebis(4,6-di-t-butylphenyl)octylphosphite, tris(2,4-di-t-butylphenyl)phosphite, tetrakis(2,4-di-t-butylphenyl)[1,1-biphenyl]-4,4'diylbisphosphonite, bis[2,4-bis(1,1-dimethylethyl)-6-methylphenyl]ethyl ester, phosphonic acid, or any combination thereof.

In the scattering particle, the compound decomposable by light and/or heat may be decomposed by light having a wavelength of 500 nm or less and/or by heat at a temperature of 80° C. or higher.

In the scattering particle, the compound decomposable by light and/or heat may include a phosphine-based ligand, an amine-based ligand, a thiol-based ligand, a polyolefin-based compound, a compound including a photosensitive functional group, or any combination thereof.

In the scattering particle, the core may include $Al_2O_3$, $SiO_2$, ZnO, $ZrO_2$, $BaTiO_3$, $TiO_2$, $Ta_2O_5$, $Ti_3O_5$, ZnO—Al, $Nb_2O_3$, SnO, MgO, or any combination thereof.

According to one or more embodiments, an ink composition includes a quantum dot, the scattering particle, and a monomer.

The quantum dot may have a core-shell structure including a core including a semiconductor compound, and a shell including an oxide of metal, an oxide of metalloid, an oxide of non-metal, a semiconductor compound, or any combination thereof.

The semiconductor compound included in the core may include a Group I-III-VI semiconductor compound.

The Group I-III-VI semiconductor compound may include AgInS, $AgInS_2$, CuInS, $CuInS_2$, $CuGaO_2$, $AgGaO_2$, $AgAlO_2$, AgInGaS, or any combination thereof.

The semiconductor compound included in the shell may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

In the ink composition, the quantum dot may be about 1 wt % to about 70 wt % in amount, and the scattering particle may be about 0.1 wt % to about 10 wt % in amount, each based on total 100 wt % of the ink composition.

According to one or more embodiments, a display apparatus includes a first substrate, a light-emitting device on the first substrate, and a light controller on the first substrate and corresponding to the light-emitting device, wherein the light controller includes a quantum dot layer and a color filter layer, and the quantum dot layer is prepared utilizing the ink composition.

The light-emitting device may include a first electrode, a second electrode facing the first electrode, and an interlayer between the first electrode and the second electrode and including an emission layer.

The interlayer may include a hole transport region including a hole injection layer, a hole transport layer, an emission auxiliary layer, an electron blocking layer, or any combination thereof, and/or an electron transport region including a hole blocking layer, an electron transport layer, an electron injection layer, or any combination thereof.

In the display apparatus, the scattering particle may include a core and a shell, and the shell may include a compound obtained by oxidizing the compound capable of reacting with oxygen and/or moisture.

The compound obtained by oxidizing the compound capable of reacting with oxygen and/or moisture may be a metal oxide.

The display apparatus may further include an inorganic capping layer.

Other aspects, features, and enhancements other than those described above will become apparent from the following drawings, claims, and detailed description.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1A:
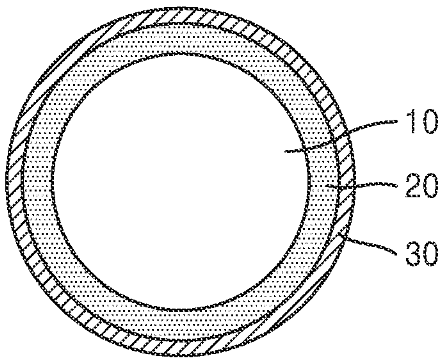
FIGS. 1A-1D are each a cross-sectional view of a scattering particle according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c", "at least one selected from a, b, and c", "at least one selected from the group consisting of a, b, and c", "at least one from among a, b, and c", etc., indicates only a, only b, only c, both (e.g., simultaneously) a and b, both (e.g., simultaneously) a and c, both (e.g., simultaneously) b and c, all of a, b, and c, or variations thereof.

As the disclosure allows for one or more suitable changes and numerous embodiments, particular embodiments will be illustrated in the drawings and described in more detail in the written description. Effects and features of the disclosure, and methods of achieving the same will be clarified by referring to embodiments described in more detail below with reference to the drawings. However, the disclosure is not limited to the following embodiments and may be embodied in one or more suitable forms.

Hereinafter, embodiments of the disclosure will be described in more detail with reference to the accompanying drawings. When describing embodiments with reference to the drawings, the same or corresponding components are denoted by the same reference numerals, and redundant descriptions thereof are omitted.

It will be understood that although the terms "first," "second," and/or the like as used herein may be used to describe one or more suitable components, these components should not be limited by these terms. These terms are only used to distinguish one component from another.

An expression used in the singular encompasses the expression of the plural, unless it has a clearly different meaning in the context.

It will be further understood that the terms "comprises", "include", "including", and/or "comprising" as used herein specify the presence of stated features or components, but do not preclude the presence or addition of one or more other features or components.

In the drawings, sizes of the components may be exaggerated or reduced for convenience of description. In other words, because sizes and thicknesses of the components in the drawings are arbitrarily illustrated for convenience of description, the following embodiments are not limited thereto.

When a certain embodiment is implemented differently, a specific process order may be performed differently from the described order. For example, two processes described in succession may be performed substantially concurrently (e.g., simultaneously), or may be performed in an order opposite to the described order.

It will be further understood that when a layer, region, or component is referred to as being "connected" to another layer, region, or component, the layer, region, or component may be "directly connected" to the other layer, region, or component, or may be "indirectly connected" to the other layer, region, or component with intervening layers, regions, or components therebetween. For example, it will be understood that when a layer, region, or component is referred to as being "electrically connected to" another layer, region, or component, the layer, region, or component may be directly electrically connected to the other layer, region, or component, or may be indirectly electrically connected to the other layer, region, or component with intervening layers, regions, or components therebetween.

According to an embodiment of the disclosure, a scattering particle may include a core and a shell, and the shell may include:

a first layer including a compound capable of reacting with oxygen and/or moisture; and a second layer including a compound decomposable by light and/or heat.

The expression "decomposable by light and/or heat" not only refers to a case in which a compound itself is decomposed by light and/or heat, but also includes, for example, a case in which, when the compound is a ligand that is bonded to a metal, the bond between the ligand and the metal is broken by light and/or heat.

Compared to Group I-III-VI semiconductor quantum dots (e.g., silver-indium-gallium-sulfide (AgInGaS, or AIGS)-based quantum dots), indium-phosphide (InP)-based quantum dots have high sensitivity to oxygen and/or moisture, and thus have a decrease in efficiency when left alone.

In more detail, in the case of the Group I-III-VI semiconductor quantum dots (e.g., AgInGaS), when a device in which a quantum dot layer is formed by curing a quantum dot composition in an ideal state in the absence of oxygen and moisture, followed by addition of a capping layer, the device may have an efficiency of 100%. However, when a device in which a quantum dot layer is formed by curing a quantum dot composition under general atmospheric conditions in the presence of oxygen and/or moisture, followed by addition of a capping layer, the device shows a decrease in efficiency to about 77.8%.

In the case of the InP-based quantum dots, a decrease in peak wavelength during surface oxidation is a main change, whereas in the case of the Group I-III-VI semiconductor quantum dots (e.g., AIGS-based quantum dots), a spectral change also appears together with a decrease in peak wavelength due to surface (e.g., GaS) oxidation. Compared to the InP-based quantum dots, the Group I-III-VI semiconductor quantum dots (e.g., AIGS-based quantum dots) have higher sensitivity to surface oxidation.

Accordingly, it is desirable or necessary to prevent or reduce surface oxidation of the Group I-III-VI semiconductor quantum dots (e.g., AIGS-based quantum dots).

Scattering particles are materials that are added to improve efficiency of quantum dots.

In an embodiment, by adding the first layer that reacts with oxygen and/or moisture to a surface of the scattering particle, in an ink composition including a quantum dot and the scattering particle, the quantum dot may be prevented or substantially prevented from reacting with oxygen and/or moisture, and thus, efficiency may be improved.

In an embodiment, the first layer may be located between the core and the second layer.

The second layer may also serve as a protective layer that prevents or substantially prevents the first layer from reacting in photo and/or thermal environments (e.g., during a storage period).

FIGS. 1A-1D are each a cross-sectional view of a scattering particle according to an embodiment.

FIG. 1A shows a cross-section of a scattering particle including a core 10 and a shell, the shell including: a first layer 20 including a compound capable of reacting with oxygen and/or moisture; and a second layer 30 including a compound decomposable by light and/or heat.

The second layer 30 may include both (e.g., simultaneously) a compound decomposable by light and a compound decomposable by heat in one layer.

In this case, after jetting an ink composition including the scattering particle and a quantum dot, the compound decomposable by light is decomposed during an ultraviolet (UV) curing process. Next, the compound decomposable by heat is decomposed during a baking process by heat, and the second layer 30 disappears (e.g., is removed). Finally, the compound capable of reacting with oxygen and/or moisture included in the remaining first layer 20 reacts with oxygen and/or moisture, which may remain in or permeate into the ink composition until a capping process is complete, before the oxygen and/or moisture reacts with the quantum dot, and thus, the quantum dot is protected from the oxygen and/or moisture.

Figure 1B:
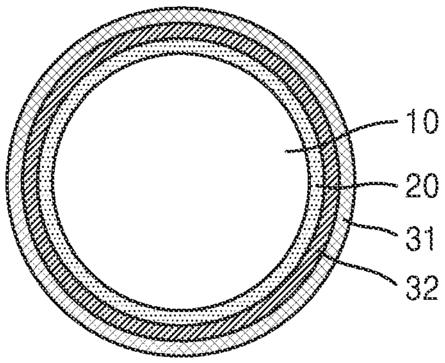

FIG. 1B shows a cross-section of a scattering particle including the core 10 and a shell, the shell including: the first layer 20 including a compound capable of reacting with oxygen and/or moisture; a second-first layer 31 including a compound decomposable by light; and a second-second layer 32 including a compound decomposable by heat.

In this case, after jetting an ink composition including the scattering particle and a quantum dot, the second-first layer 31 including the compound decomposable by light is decomposed during a UV curing process. Next, the second-second layer 32 including the compound decomposable by heat is decomposed during a baking process by heat. Finally, the compound capable of reacting with oxygen and/or moisture included in the remaining first layer 20 reacts with oxygen and/or moisture, which may remain in or permeate into the ink composition until a capping process is complete, before the oxygen and/or moisture reacts with the quantum dot, and thus, the quantum dot is protected from the oxygen and/or moisture.

Figure 1C:
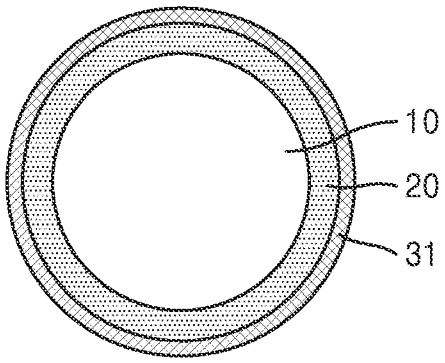

FIG. 1C shows a cross-section of a scattering particle including the core 10 and a shell, the shell including: the first layer 20 including a compound capable of reacting with oxygen and/or moisture; and the second-first layer 31 including a compound decomposable by light.

In this case, after jetting an ink composition including the scattering particle and a quantum dot, the second-first layer 31 including the compound decomposable by light is decomposed during a UV curing process. The compound capable of reacting with oxygen and/or moisture included in the remaining first layer 20 reacts with oxygen and/or moisture, which may remain in or permeate into the ink composition until a capping process is complete, before the oxygen and/or moisture reacts with quantum dot, and thus, the quantum dot is protected from the oxygen and/or moisture.

Figure 1D:
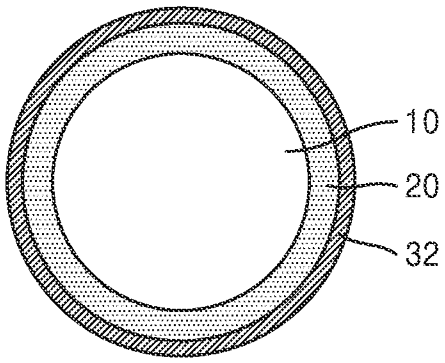

FIG. 1D shows a cross-section of a scattering particle including the core 10 and a shell, the shell including: the first layer 20 including a compound capable of reacting with oxygen and/or moisture; and the second-second layer 32 including a compound decomposable by heat.

In this case, after jetting an ink composition including the scattering particle and a quantum dot, the second-second layer 32 including the compound decomposable by heat is decomposed during a baking process by heat. The compound capable of reacting with oxygen and/or moisture included in the remaining first layer 20 reacts with oxygen and/or moisture, which may remain in or permeate into the ink composition until a capping process is complete, before the oxygen and/or moisture reacts with quantum dot, and thus, the quantum dot is protected from the oxygen and/or moisture.

In an embodiment, the first layer 20, the second layer 30, the second-first layer 31, and/or the second-second layer 32 may each independently have an uneven structure to increase a surface area thereof. When the surface area is increased, reactions may proceed more rapidly.

In an embodiment, the compound capable of reacting with oxygen and/or moisture may include a metal, a phenol-based compound, a phosphorus-based compound, a sulfur-based compound, or any combination thereof.

For example, the compound capable of reacting with oxygen and/or moisture may include an alkali metal, an alkaline earth metal, a Group III metal, ethylenebis(oxyethylene)bis-(3-(5-tert-butyl-4-hydroxy-m-tolyl)propionate), 3,9-bis[2-[3-(3-t-butyl-4-hydroxy-5-methylphenyl)propionyloxy]-1,1-dimethylethoxy]-2,4,8,10-tetraoxaspiro[5.5] undecane, pentaerythrityl tetrakis[3-(3,5-di-t-butyl-4-hydroxyphenyl)propionate], 1,3,5,-trimethyl-2,4,6,-tris(3'5'-di-t-butyl-4-hydroxybenzyl)benzene, triethyleneglycol-bis [3-(3-t-butyl-5-methyl-4-hydroxyphenyl)propionate], 4,4'-thiobis(6-t-butyl-3-methylphenol), tris-(3,5-di-t-butyl-4-hydroxybenzyl)-isocyanurate, 1,3,5-tris(4-t-butyl-3-hydroxy-2,6-dimethylbenzyl)-isocyanurate, 1,6-hexanediol-bis[3-(3,5-di-t-butyl-4-hydroxyphenyl)propionate], 2,2-thio-diethylenebis[3-(3,5-di-t-butyl-4-hydroxyphenyl) propionate], N,N'-hexamethylenebis(3,5-di-t-butyl-4-hydroxy-hydrocinnamamide), 1,3,5-trimethyl-2,4,6-tris(3, 5-di-t-butyl-4-hydroxybenzyl)benzene, 2,4-bis[(octylthio) methyl]-O-cresol, 1,6-hexanediol-bis-[3-(3,5-di-t-butyl-4-hydroxyphenyl)propionate], octadecyl-[3-(3,5-di-t-butyl-4-hydroxyphenyl)propionate], 2,2'-methylenebis(4-methyl-6-t-butylphenol), 4,4'-butylidene-bis(3-methyl-6-t-butylphenol), 1,1,3-tris(2-methyl-4-hydroxy-5-t-butylphenyl)butane, 1,3,5-tris(4-hydroxybenzyl)benzene, tetrakis[methylene-3-(3,5'-di-t-butyl-4'-hydroxyphenylpropionate)]methane, sodium hydrogen sulfite, sodium sulfite, 2,2-bis({[3-(dodecylthio)propionyl]oxy}methyl)-1,3-propanediyl-bis[3-(dodecylthio)propionate], 2-mercaptobenzimidazole, dilauryl-3,3'-thiodipropionate, dimyristyl-3,3'-thiodipropionate, distearyl-3,3'-thiodipropionate, pentaerythrityl-tetrakis(3-laurylthiopropionate), 3,9-bis(2,6-di-tert-butyl-4-methylphenoxy)-2,4,8,10-tetraoxa-3,9-diphosphaspiro[5.5]undecane, diisodecyl pentaerythritol diphosphite, bis(2,4-di-t-butylphenyl)pentaerythritol diphosphite, 2,2'-methylenebis(4,6-di-t-butyl-1-phenyloxy) (2-ethylhexyloxy)phosphorus, 6-[3-(3-t-butyl-4-hydroxy-5-methylphenyl)propoxy]-2,4,8,10-tetra-t-butyldibenz[d,f][1, 3,2]dioxaphospepine, triphenyl phosphite, diphenyl isodecyl phosphite, phenyl diisodecyl phosphite, 4,4'-butylidene-bis (3-methyl-6-t-butylphenylditridecyl)phosphite, octadecyl phosphite, tris(nonylphenyl)phosphite, 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, 10-decyloxy-9,10-dihydro-9-oxa-10-phosphaphenanthrene-10-oxide, tris(2,4-di-t-butylphenyl)phosphite, cyclic neopentanetetraylbis(2,4-di-t-butylphenyl)phosphite, cyclic neopentanetetraylbis(2,6-di-t-butylphenyl)phosphite, 2,2-methylenebis(4,6-di-t-butylphenyl)octylphosphite, tris(2,4-di-t-butylphenyl) phosphite, tetrakis(2,4-di-t-butylphenyl)[1,1-biphenyl]-4, 4'diylbisphosphonite, bis[2,4-bis(1,1-dimethylethyl)-6-methylphenyl]ethyl ester, phosphonic acid, or any combination thereof.

In an embodiment, the compound decomposable by light and/or heat may be decomposed by light having a wavelength of 500 nm or less and/or by heat at a temperature of 80° C. or higher. For example, the compound decomposable by light may be decomposed by UV. For example, the compound decomposable by heat may be decomposed by heat at a temperature of 100° C. or higher.

In one or more embodiments, the compound decomposable by light and/or heat may be stable with light having a wavelength greater than 500 nm and/or heat at a temperature of less than 80° C. For example, the compound decomposable by light and/or heat may be stable (not decomposable) with visible light and/or heat at a temperature of about 70° C.

Accordingly, the second layer 30 including the compound decomposable by light and/or heat may be a protective layer that prevents or substantially prevents the first layer 20 including the compound capable of reacting with oxygen and/or moisture from reacting with oxygen and/or moisture during movement (e.g., shipping) and storage of the ink composition.

In an embodiment, the compound decomposable by light and/or heat may include a phosphine-based ligand, an amine-based ligand, a thiol-based ligand, a polyolefin-based compound, a compound including a photosensitive functional group, or any combination thereof.

For example, the compound decomposable by light and/or heat may include monopropylphosphine, tripropylphosphine, tributylphosphine, trihexylphosphine, trioctylphosphine, monopropylamine, tripropylamine, tributylamine, trihexylamine, triheptylamine, trioctylamine, ethanethiol, propanethiol, butanethiol, pentanethiol, hexanethiol, or any combination thereof.

In an embodiment, the core may include $Al_2O_3$, $SiO_2$, ZnO, $ZrO_2$, $BaTiO_3$, $TiO_2$, $Ta_2O_5$, $Ti_3O_5$, ZnO—Al, $Nb_2O_3$, SnO, MgO, or any combination thereof.

In an embodiment, a size of the scattering particle may be in a range of about 50 nm to about 250 nm.

In an embodiment, thicknesses of the first layer 20, the second layer 30, the second-first layer 31, and the second-second layer 32 in the scattering particle may each independently be in a range of about 2 Å to about 1,000 nm. For example, the thicknesses of the first layer 20, the second layer 30, the second-first layer 31, and the second-second layer 32 may each independently be in a range of about 3 Å to about 500 nm. For example, the thicknesses of the first layer 20, the second layer 30, the second-first layer 31, and the second-second layer 32 may each independently be in a range of about 4 Å to about 300 nm.

According to another embodiment of the disclosure, an ink composition may include a quantum dot, the scattering particle, and a monomer.

In an embodiment, the quantum dot may have a core-shell structure including: a core including a semiconductor compound; and a shell including an oxide of a metal, a metalloid, or a non-metal, a semiconductor compound, or a combination thereof. For example, a material included in the core and a material included in the shell may be different from each other.

The shell of the quantum dot may act as a protective layer that prevents or reduces chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases toward the center of the core.

A full width at half maximum (FWHM) of an emission wavelength spectrum of the quantum dot may be about 45 nm or less, for example, about 40 nm or less, or, about 30 nm or less, and within these ranges, color purity or color reproducibility may be improved. In some embodiments, because light emitted through the quantum dot is emitted in all directions, an optical viewing angle may be improved.

In some embodiments, the quantum dot may be in the form of a spherical particle, a pyramidal particle, a multi-arm particle, a cubic nanoparticle, a nanotube particle, a nanowire particle, a nanofiber particle, or a nanoplate particle.

Because the energy band gap may be adjusted by controlling the size of the quantum dot, light having one or more suitable wavelength bands may be obtained from an emission layer including the quantum dot. Accordingly, by utilizing quantum dots of different sizes, a light-emitting device that emits light of one or more suitable wavelengths may be implemented. In more detail, the size of the quantum dot may be selected to emit red, green, and/or blue light. In some embodiments, the size of the quantum dot may be configured to emit white light by combination of light of one or more suitable colors.

In an embodiment, semiconductor compound included in the core may include a Group I-III-VI semiconductor compound.

In an embodiment, the Group I-III-VI semiconductor compound may include AgInS, $AgInS_2$, CuInS, $CuInS_2$, $CuGaO_2$, $AgGaO_2$, $AgAlO_2$, AgInGaS, or any combination thereof.

In an embodiment, the semiconductor compound included in the shell may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

In an embodiment, a content (e.g., amount) of the quantum dot may be in a range of about 1 wt % to about 70 wt %, and a content (e.g., amount) of the scattering particle may be in a range of about 0.1 wt % to about 10 wt % (based on total 100 wt % of the ink composition). In the ink composition, components other than the quantum dot and the scattering particle may be monomers (e.g., acrylic monomers including terminals including acrylate, diacrylate, and/or methacrylate groups). For example, the content (e.g., amount) of the quantum dot may be in a range of about 10 wt % to about 50 wt %, and the content (e.g., amount) of the scattering particle may be in a range of about 1 wt % to about 7 wt % (based on total 100 wt % of the composition).

According to another embodiment of the disclosure, a display apparatus may include:

- a first substrate on which a light-emitting device is located; and
- a light controller on the first substrate and corresponding to the light-emitting device,
- wherein the light controller may include a quantum dot layer and a color filter layer, and
- the quantum dot layer may be a layer prepared by utilizing the ink composition.

In an embodiment, the light-emitting device may include:

- a first electrode; a second electrode facing the first electrode; and an interlayer between the first electrode and the second electrode and including an emission layer.

In an embodiment, the interlayer may further include: a hole transport region including a hole injection layer, a hole transport layer, an emission auxiliary layer, an electron blocking layer, or any combination thereof; and/or

- an electron transport region including a hole blocking layer, an electron transport layer, an electron injection layer, or any combination thereof.

In an embodiment, the scattering particle may include a core and a shell, and the shell may include a compound obtained by oxidizing a compound capable of reacting with oxygen and/or moisture.

In the display apparatus according to an embodiment, the ink composition undergoes a curing process and/or a baking process in a process of forming the quantum dot layer. In the curing process and/or the baking process, the second layer of the scattering particle included in the ink composition is decomposed as described above, and the first layer of the scattering particle protects the quantum dot by reacting with oxygen and/or moisture. For example, the second layer may include (e.g., consist of) the second-first layer. For example, the second layer may include (e.g., consist of) the second-first layer and the second-second layer. For example, the second layer may include (e.g., consist of) the second-second layer.

Accordingly, in the display apparatus according to an embodiment, the shell of the scattering particle may include a compound obtained by oxidizing a compound capable of reacting with oxygen and/or moisture.

For example, the compound obtained by oxidizing a compound capable of reacting with oxygen and/or moisture may be obtained by oxidizing a compound including a metal, a phenol-based compound, a phosphorus-based compound, a sulfur-based compound, or any combination thereof. For example, the compound obtained by oxidizing a compound capable of reacting with oxygen and/or moisture may be a metal oxide. For example, the compound obtained by oxidizing a compound capable of reacting with oxygen and/or moisture may be an oxide of an alkali metal, an oxide of an alkaline earth metal, or an oxide of a Group 3 metal. For example, the compound obtained by oxidizing a compound capable of reacting with oxygen and/or moisture may be an oxide of aluminum (Al).

In an embodiment, the display apparatus may further include an inorganic capping layer. The term "inorganic capping layer" refers to a capping layer formed in the above-described capping process.

Hereinafter, the disclosure will be described with reference to the drawings.

Figure 2:
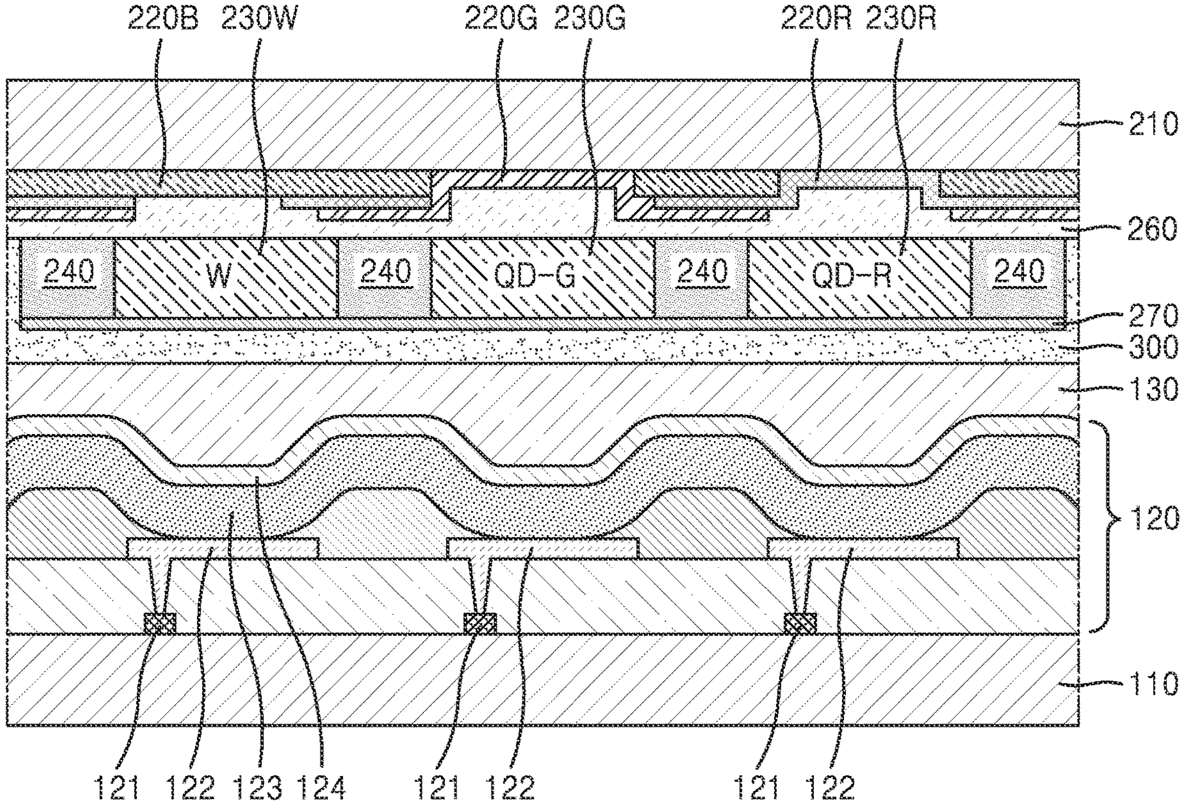
FIG. 2 is a cross-sectional view of a display apparatus according to an embodiment.

FIG. 2 is a cross-sectional view of a display apparatus according to an embodiment. In FIG. 2, a plurality of light-emitting devices and a plurality of light controllers are shown. In addition, although only one set of three-color pixels of red, green, and blue is shown in FIG. 2, a plurality of sets of such three-color pixels may be distributed in an actual product.

As shown in FIG. 2, the display apparatus of the present embodiment has a structure in which a first substrate 110, on which a light-emitting device 120 is located, is bonded to a second substrate 210, on which quantum dot layers 230R and 230G, a scattering layer 230W, and color filter layers 220R, 220G, and 220B as light controllers are located, with a filling material 300 between the first substrate 110 and the second substrate 210. In this case, an inorganic capping layer 270 may be present between the light-emitting device 120 and the quantum dot layers 230R and 230G.

According to one or more embodiments, the quantum dot layers 230R and 230G, the scattering layer 230W, and the color filter layers 220R, 220G, and 220B as light controllers may be directly stacked on the light-emitting device 120. For example, after the light controllers are directly stacked on the light-emitting device 120 located on the first substrate 110, the first substrate 110 and the second substrate 210 may be bonded to each other to manufacture a display apparatus. In this case, the inorganic capping layer 270 may be present between the quantum dot layers 230R and 230G and the color filter layers 220R and 220G, and the inorganic capping layer 270 may be present between the scattering layer 230W and the color filter layer 220B.

According to one or more embodiments, a display apparatus may be manufactured such that the quantum dot layers 230R and 230G, the scattering layer 230W, and the color filter layers 220R, 220G, and 220B as light controllers may be directly stacked on the light-emitting device 120 located on the first substrate 110, without a second substrate. In this case, the inorganic capping layer 270 may be present between the quantum dot layers 230R and 230G and the color filter layers 220R and 220G, and the inorganic capping layer 270 may be present between the scattering layer 230W and the color filter layer 220B.

The light-emitting device 120 has a structure in which an interlayer 123 including an emission layer is between a first electrode 122 and a second electrode 124, and generates light based on the principle in which holes and electrons respectively injected from the first electrode 122 and the second electrode 124 recombine in the emission layer in the interlayer 123 to emit light. For example, red, green, and blue pixels may be to absorb, transmit, and/or generate light having a wavelength in a range of about 380 nm to about 780 nm. For example, the light-emitting device 120 may generate light having a wavelength in a range of about 380 nm to about 500 nm, light having a wavelength in a range of about 380 nm to about 650 nm, or light having a wavelength in a range of about 380 nm to about 780 nm, and the light controller of each pixel may convert the generated light into red, green, or blue light. The light-emitting device 120 will be described in more detail later.

Reference numeral 121 denotes a pixel circuit connected to the first electrode 122, and includes elements such as a thin-film transistor and/or a capacitor. In addition, reference numeral 130 denotes a thin-film encapsulation layer that protects the light-emitting device 120 by covering the same, and may be a single-layered film as an organic film or an inorganic film, or may be a multi-layered film in which an organic film and an inorganic film are alternately stacked. The inorganic film may include silicon oxide, silicon nitride, and/or silicon oxynitride, and the organic film may include polyethylene terephthalate, polyethylene naphthalate, polycarbonate, polyimide, polyethylene sulfonate, polyoxymethylene, polyarylate, hexamethyldisiloxane, acrylic resin (e.g., polymethyl methacrylate, polyacrylic acid, etc.), or any combination thereof.

The light controllers may include a quantum dot layer, a color filter layer, a scattering layer, or any combination thereof. The quantum dot layer may be a layer formed of an ink composition including a quantum dot, the scattering particle according to an embodiment, and a monomer.

The quantum dot layers 230R and 230G, the scattering layer 230W, and the color filter layers 220R, 220G, and 220B are provided as the light controllers. The quantum dot layers 230R and 230G convert blue light generated by the light-emitting device 120 into a desired or suitable color, such as red or green, and the color filter layers 220R, 220G, and 220B increase the color purity by filtering out other colors of light that may be in the converted color. In this regard, a red pixel and a green pixel include the quantum dot layers 230R and 230G and the color filter layers 220R and 220G, respectively, whereas a blue pixel includes the scattering layer 230W and the blue color filter layer 220B. This is because the light generated by the light-emitting device 120 is, for example, blue light. For example, because the blue pixel does not need to change a color of light and only needs to allow the light to pass through the scattering layer 230W, the blue pixel includes only the blue color filter layer 220B for filtering out the other colors of light. Because the scattering layer 230W does not include a quantum dot, the scattering layer 230W may include a common scattering particle instead of the scattering particle according to an embodiment. The term "common scattering particle" may refer to a structure without a shell coating a core. The common scattering particle may include, for example, an oxide of titanium, silver, aluminum, or any combination thereof.

Reference numeral 260 denotes a low refractive index layer having a refractive index of about 1.2. Side-scattered light that has passed through the quantum dot layers 230R and 230G and the scattering layer 230W is totally reflected at an interface of the low refractive index layer 260 due to a difference between a refractive index of the quantum dot layers 230R and 230G and the scattering layer 230W and a refractive index of the low refractive index layer 260, so that the light is re-scattered inside the quantum dot layers 230R and 230G and the scattering layer 230W. The low refractive index layer 260 serves to increase luminance by changing side scattering to front scattering.

The quantum dot layers 230R and 230G may be formed by a solution process, for example, an inkjet process, by utilizing an ink composition for forming quantum dots. The ink composition may include a quantum dot, the scattering particle according to an embodiment, a monomer, an initiator, and an additive. The additive may include, for example, a dispersant, a viscosity modifier, or any combination thereof. The ink composition may not include (e.g., may exclude) a solvent. The dispersant may include, for example, a polyacrylic dispersant, a polyurethane-based dispersant, a polyethylene-based dispersant, an epoxy-based dispersant, an ester-based dispersant, and/or the like. The initiator may be a common initiator utilized to cure polymers.

The initiator may include, for example, TPO, 4-(4-Methylphenylthio)benzophenone (Quantacure BMS), oxime-based compound as follows, or ethyl phenyl(2,4,6-trimethylbenzoyl)phosphinate:

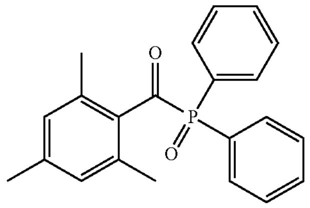

TPO

-continued

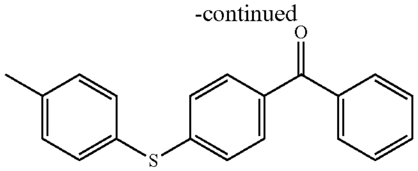

Quantacure BMS

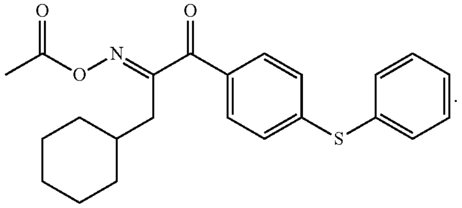

Oxime-type

The initiator may be included in an amount of about 0.1 wt % to about 50 wt % based on 100 wt % of the monomer.

The additive may be included in an amount of about 0.1 wt % to about 50 wt % based on 100 wt % of the monomer.

The scattering layer 230W may be formed by a solution process, for example, an inkjet process, by utilizing an ink composition for forming a scattering layer. For example, the ink composition may be the same as the ink composition for forming quantum dots, except that a common scattering particle is added instead of a quantum dot, and the scattering particle according to an embodiment is not added. Because the scattering layer 230W does not include a quantum dot, the scattering layer 230W does not need to include the scattering particle according to an embodiment.

Reference numeral 240 in FIG. 2 denotes a bank that defines a boundary between the light controllers of each pixel.

A portion formed by overlapping the color filter layers 220R, 220G, and 220B between the bank 240 and the second substrate 210 may function as a black matrix.

One surface of the bank 240 facing the first substrate 110 may have a hydrophobic property. Light (e.g., monochromatic light) generated from a light source (e.g., an organic light-emitting device) is converted into a color from among red, green, and blue while passing through a quantum dot layer and a color filter, and then is emitted.

In forming the bank 240, a bank composition is applied on a substrate and cured, and then undergoes a photolithography process. The bank composition includes a curable polymer, a photoresist compound, a fluorine-containing polymer, a black pigment, a scattering agent, and a solvent, wherein, when the bank composition is cured, the solvent evaporates completely.

Between the first substrate 110 and the second substrate 210, the filling material 300 functions as both (e.g., simultaneously) a binding agent and a gap maintainer that maintains an appropriate or suitable distance between the first substrate 110 and the second substrate 210. Accordingly, when the filling material 300 is coated between the first substrate 110 and the second substrate 210, which are then bonded together, the filling material 300 firmly bonds the first substrate 110 and the second substrate 210 while properly maintaining a gap therebetween.

The display apparatus having the above structure may be manufactured through a process shown in FIGS. 3A-3E.

Figure 3A:
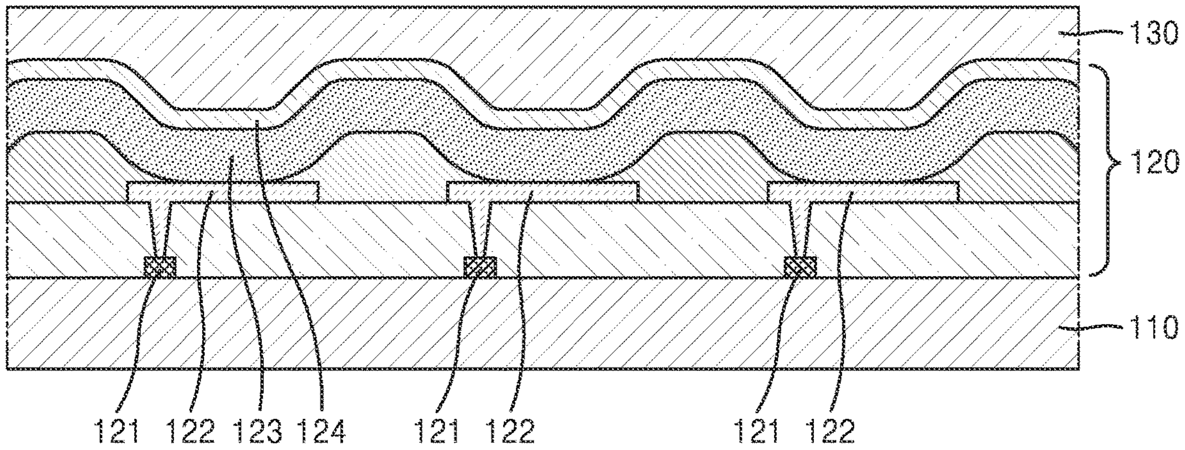
FIGS. 3A-3E are each a cross-sectional view sequentially showing a process of manufacturing the display apparatus of FIG. 2.

First, as shown in FIG. 3A, the light-emitting device 120 is formed on the first substrate 110, and is covered by the thin-film encapsulation layer 130.

Figure 3B:
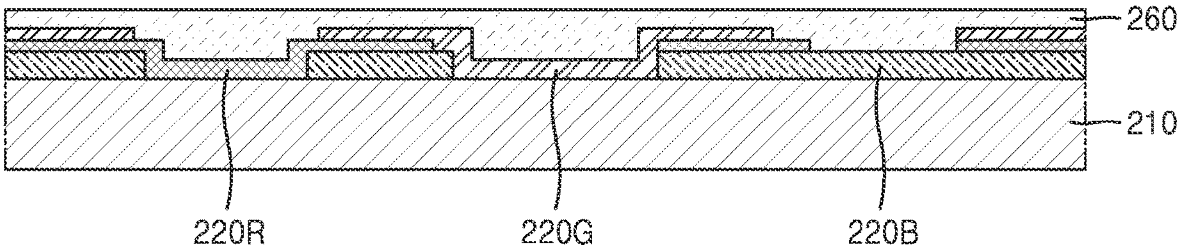

Then, as shown in FIG. 3B, the color filter layers 220R, 220G, and 220B is patterned on the second substrate 210. The color filter layers 220R, 220G, and 220B are formed at positions corresponding to the light-emitting device 120, and a partial region, in which the color filter layer 220R, the color filter layer 220G, and the color filter layer 220B overlap, functions as a black matrix. For example, a hollow silica material is prepared on the color filter layers 220R, 220G, and 220B to form the low refractive index layer 260 on the color filter layers 220R, 220G, and 220B. The low refractive index layer 260 may have a refractive index of about 1.1 to about 1.5 and a thickness of about 0.1 μm to about 5 μm.

Figure 3C:
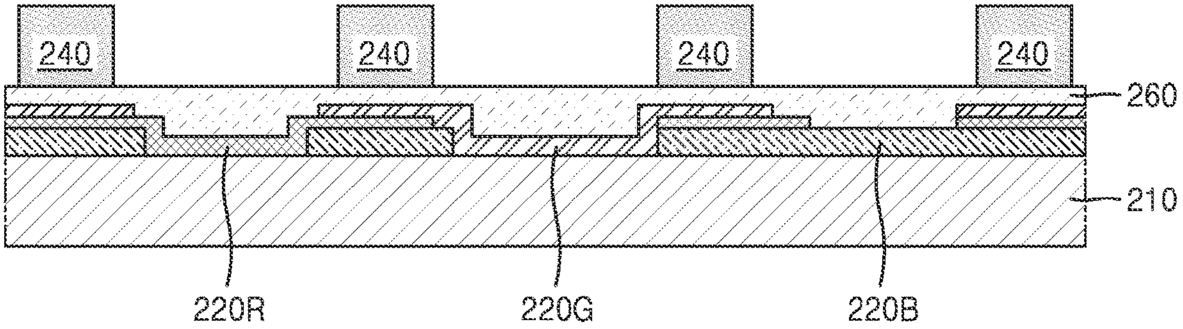

Next, on the low refractive index layer 260, as shown in FIG. 3C, the bank 240 is patterned on a region in which the color filter layers 220R, 220G, and 220B overlap such that the bank 240 remain for each position between the color filter layers 220R, 220G, and 220B between each pixel.

Figure 3D:
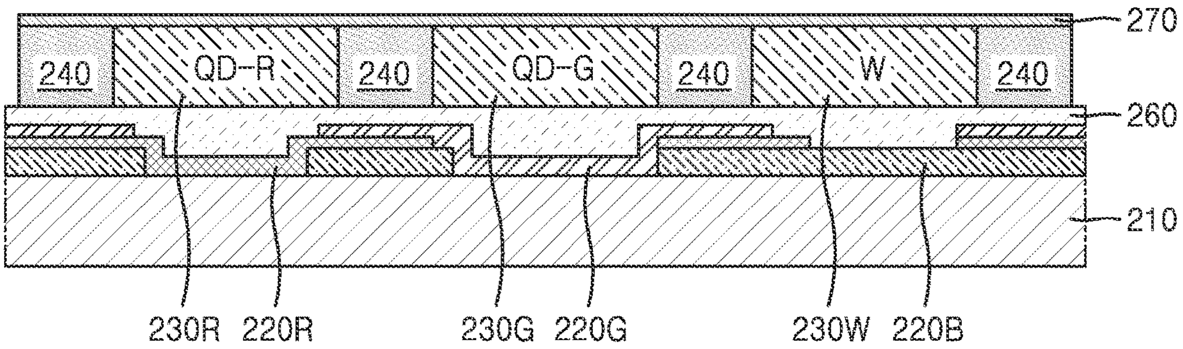

Thereafter, as shown in FIG. 3D, the quantum dot layers 230R and 230G are formed in the red pixel and the green pixel, and the scattering layer 230W is formed in the blue pixel. In this regard, the quantum dot layers 230R and 230G are formed at positions overlapping the color filter layers 220R and 220G. The scattering layer 230W is formed at a position overlapping the color filter layer 220B. The quantum dot layers 230R and 230G and the scattering layer 230W may be formed by an inkjet process.

Quantum dots, which are photochromic particles included in the quantum dot layers 230R and 230G, may be the same as described above.

After the quantum dot layers 230R and 230G and/or the scattering layer 230W are formed (e.g., injected at respective locations), the quantum dot layers 230R and 230G and the scattering layer 230W may be formed through a curing process (e.g., utilizing UV having a wavelength of about 390 nm for less than 1 minute).

Next, post-baking is performed, and the inorganic capping layer 270 is formed by vapor chemical deposition.

The inorganic capping layer 270 may be a layer including Si, N, any combination thereof, or an oxide of any combination thereof and may have a thickness of about 1,000 Å to about 10,000 Å.

The inorganic capping layer 270 serves to prevent or reduce permeation of oxygen and/or moisture. In general, quantum dot efficiency is continuously decreased due to oxygen and moisture in a standby state until the inorganic capping layer 270 is formed. An environment free of oxygen and moisture (e.g., a $N_2$ atmosphere) may be desired or required in to reduce the decrease in quantum dot efficiency.

However, in an embodiment, the quantum dot layers 230R and 230G include the scattering particle including the shell having the first layer including a compound capable of reacting with oxygen and/or moisture. Accordingly, because oxygen and/or moisture present in the quantum dot layers 230R and 230G react first with the first layer of the scattering particle, a quantum dot may be protected from the oxygen and/or moisture.

Accordingly, in the display apparatus according to an embodiment, the decrease in quantum dot efficiency may be reduced in the presence of oxygen and moisture until an inorganic capping process is carried out. That is, in the display apparatus according to an embodiment, the scattering particles with the shell having the first layer may consume the oxygen and/or moisture in the quantum dot layers 230R and 230G before the inorganic capping layer is formed, and thereby the decrease in quantum dot efficiency may be reduced.

Figure 3E:
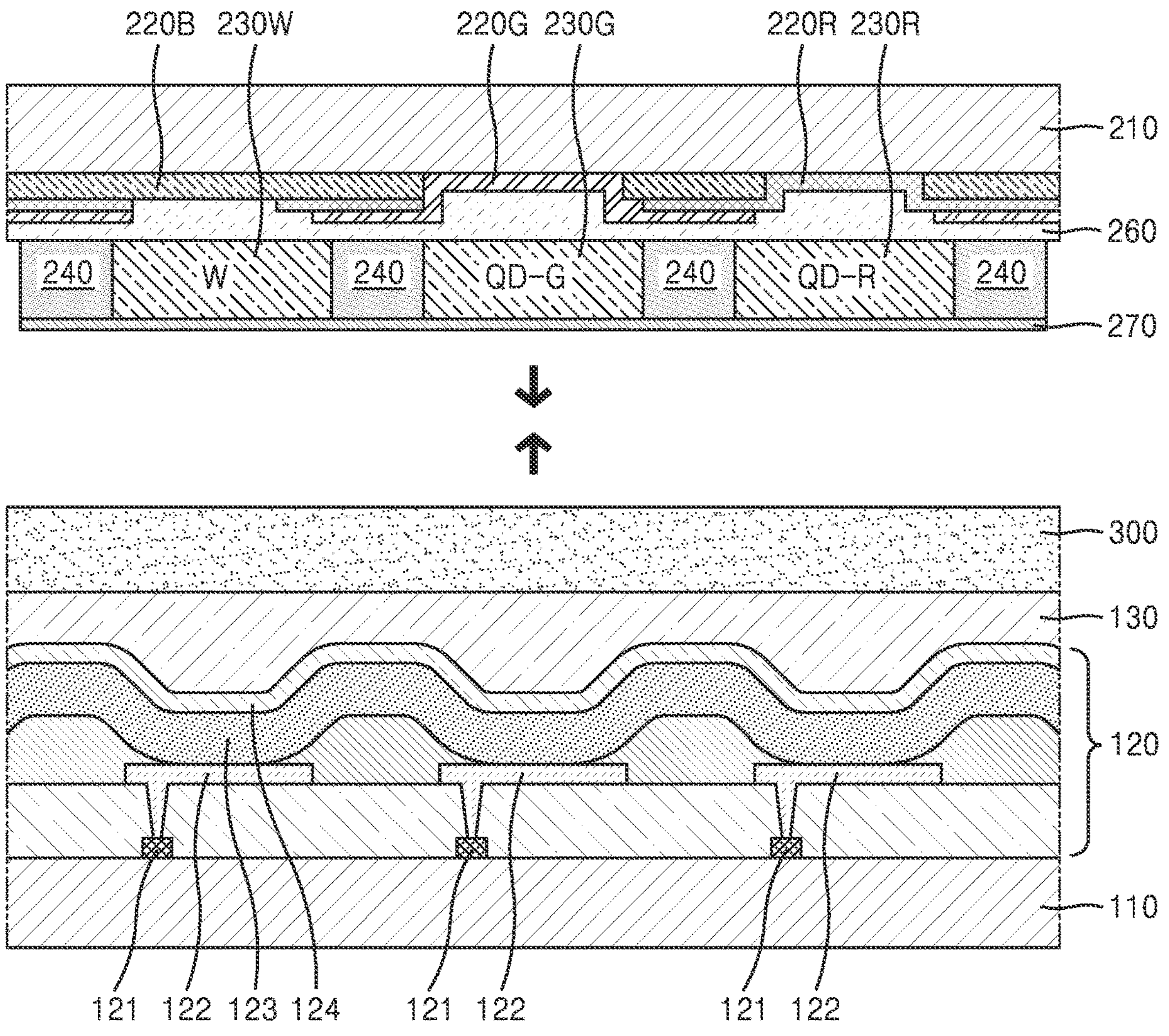

Next, as shown in FIG. 3E, the filling material 300 is applied between the first and second substrates 110 and 210, and the first and second substrates 110 and 210 are bonded together. Then, as shown in FIG. 2, a display apparatus having the light-emitting device 120, the quantum dot layers 230R and 230G, and the color filter layers 220R, 220G, and 220B is implemented.

Figure 4:
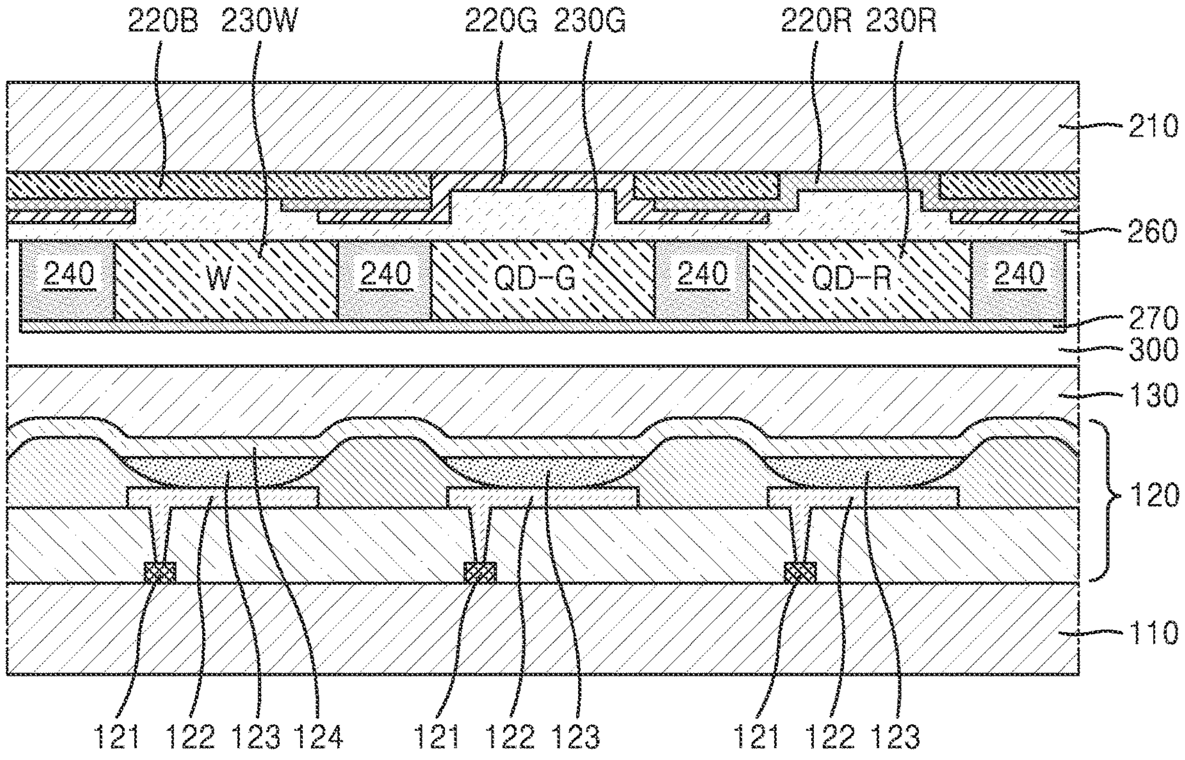
FIG. 4 is a cross-sectional view of a display apparatus according to another embodiment.

The present embodiment illustrates a case in which the interlayer 123 including the emission layer is formed as a common layer across the entire pixel area. However, as shown in FIG. 4, a modification example in which an interlayer is separately formed for each pixel is also possible. For example, the interlayer 123 including the emission layer may be formed as a common layer, or may be formed separately for each pixel.

The emission layer may include an organic light-emitting material or a light-emitting material.

The light-emitting device 120 will be described in more detail.

First Electrode 122

In FIG. 2, a substrate may be additionally located under the first electrode 122 or above the second electrode 124. As the substrate, a glass substrate or a plastic substrate may be utilized.

The first electrode 122 may be formed by, for example, depositing or sputtering a material for forming the first electrode 122 on the substrate. When the first electrode 122 is an anode, a material for forming the first electrode 122 may be a high work function material that facilitates injection of holes.

The first electrode 122 may be a reflective electrode, a semi-transmissive electrode, or a transmissive electrode. When the first electrode 122 is a transmissive electrode, a material for forming the first electrode 122 may be indium tin oxide (ITO), indium zinc oxide (IZO), tin oxide ($SnO_2$), zinc oxide (ZnO), or any combination thereof. In one or more embodiments, when the first electrode 122 is a semi-transmissive electrode or a reflective electrode, a material for forming the first electrode 122 may be magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 122 may have a single-layered structure consisting of a single layer or a multi-layered structure including a plurality of layers. For example, the first electrode 122 may have a three-layered structure of ITO/Ag/ITO.

Interlayer 123

The interlayer 123 is located on the first electrode 122. The interlayer 123 may include an emission layer.

The interlayer 123 may further include a hole transport region located between the first electrode 122 and the emission layer and an electron transport region located between the emission layer and the second electrode 124.

The interlayer 123 may further include, in addition to one or more suitable organic materials, a metal-containing compound, such as an organometallic compound, an inorganic material, such as a quantum dot, and/or the like.

In one or more embodiments, the interlayer 123 may include i) two or more emitting units sequentially stacked between the first electrode 122 and the second electrode 124 and ii) a charge generation layer located between the two or more emitting units. When the interlayer 123 includes the two or more emitting units and the charge generation layer as described above, the light-emitting device 120 may be a tandem light-emitting device.

Hole Transport Region in Interlayer 123

The hole transport region may have i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, the layers of each structure being stacked sequentially from the first electrode 122.

The hole transport region may include a compound represented by Formula 201, a compound represented by Formula 202, or any combination thereof:

Formula 201

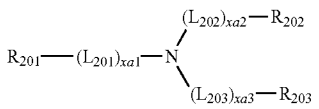

Formula 202

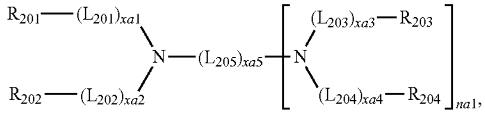

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group, etc.) unsubstituted or substituted with at least one $R_{10a}$, $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

For example, each of Formulae 201 and 202 may include at least one of the groups represented by Formulae CY201 to CY217:

CY201

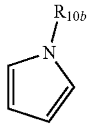

CY202

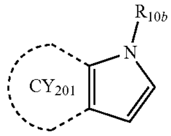

CY203

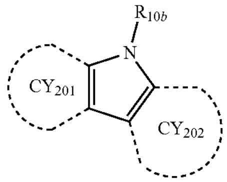

CY204

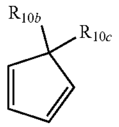

CY205

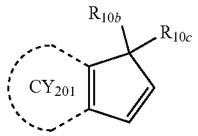

CY206

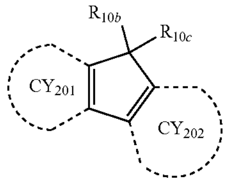

CY207

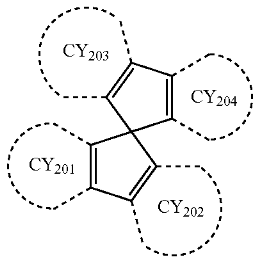

CY208

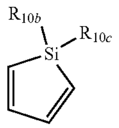

-continued

CY209

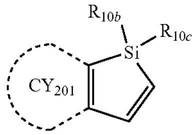

CY210

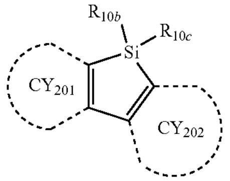

CY211

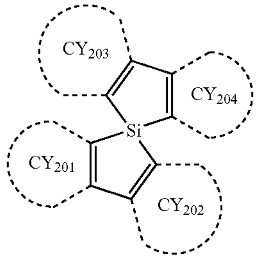

CY212

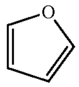

CY213

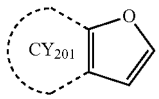

CY214

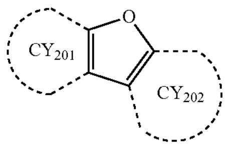

CY215

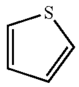

CY216

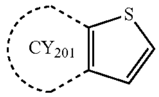

CY217

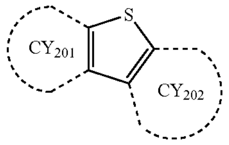

, wherein, in Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted from the emission layer, and the electron blocking layer may block or reduce the leakage of electrons from the emission layer to the hole transport region. Materials that may be included in the hole transport region may be included in the emission auxiliary layer and the electron blocking layer.

p-Dopant

The hole transport region may further include, in addition to the above-described materials, a charge-generation material for improving conductive properties. The charge-generation material may be uniformly or non-uniformly dispersed in the hole transport region (e.g., in the form of a single layer consisting of a charge-generation material).

The charge-generation material may be, for example, a p-dopant.

For example, a lowest unoccupied molecular orbital (LUMO) energy level of the p-dopant may be −3.5 eV or less.

In an embodiment, the p-dopant may include a quinone derivative, a cyano group-containing compound, a compound containing element EL1 and element EL2, or any combination thereof.

Examples of the quinone derivative may include TCNQ, F4-TCNQ, and/or the like.

Examples of the cyano group-containing compound may include HAT-CN, a compound represented by Formula 221, and/or the like:

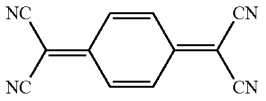

TCNQ

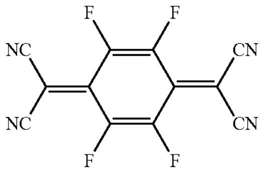

F4-TCNQ

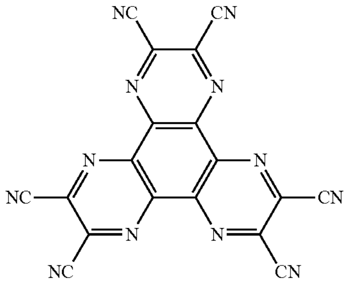

HAT-CN

-continued

Formula 221

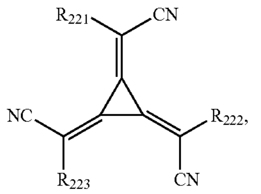

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or any combination thereof, and element EL2 may be a non-metal, a metalloid, or any combination thereof.

Emission Layer in Interlayer 123

When the light-emitting device 120 is a full-color light-emitting device, the emission layer may be patterned into a red emission layer, a green emission layer, and/or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other to emit white light. In one or more embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

An amount of the dopant in the emission layer may be in a range of about 0.01 part by weight to about 15 parts by weight based on 100 parts by weight of the host.

In one or more embodiments, the emission layer may include a quantum dot. The quantum dot is the same as described above.

In an embodiment, the emission layer may include a delayed fluorescence material. The delayed fluorescence material may act (e.g., serve) as a host or a dopant in the emission layer.

A thickness of the emission layer may be in a range of about 100 Å to about 1,000 Å, for example, about 200 Å to about 600 Å. When the thickness of the emission layer is within these ranges, excellent or suitable light-emission characteristics may be obtained without a substantial increase in driving voltage.

Host

The host may include a compound represented by Formula 301:

$$[Ar_{301}]_{xb11}-[(L_{301})_{xb1}-R_{301}]_{xb21}$$ Formula 301 wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each independently be the same as described in connection with $Q_2$.

For example, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

Formula 301-1

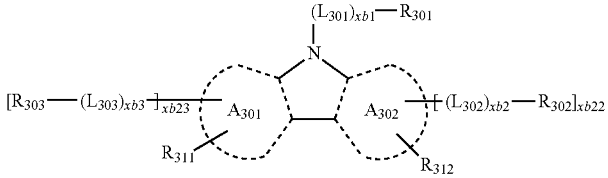

Formula 301-2

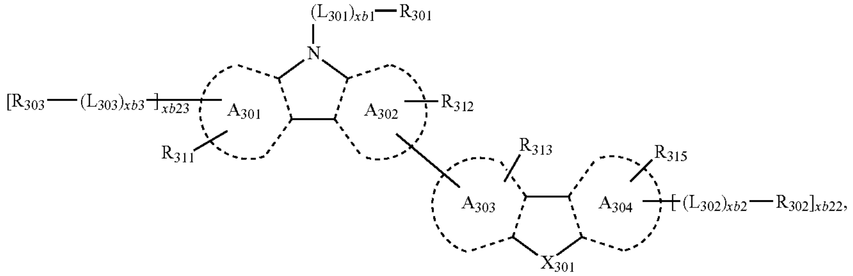

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[($L_{304}$)$_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

Formula 401

$$M(L_{401})_{xc1}(L_{402})_{xc2}$$

Formula 402

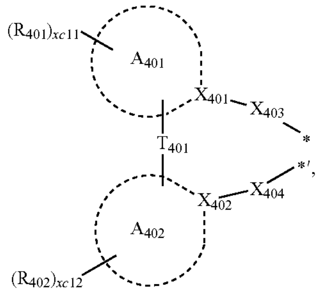

wherein, in Formulae 401 and 402,

M may be a transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is two or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —$N(Q_{411})$-, —$C(Q_{411})(Q_{412})$-, —$C(Q_{411})$=$C(Q_{412})$-, —$C(Q_{411})$=, or =C=, $X_{403}$ and $X_{404}$ may each independently be a chemical bond (e.g., a covalent bond or a coordinate bond), O, S, $N(Q_{413})$, $B(Q_{413})$, $P(Q_{413})$, $C(Q_{413})(Q_{414})$, or $Si(Q_{413})(Q_{414})$, and $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{401})(Q_{402})(Q_{403})$, —$N(Q_{401})(Q_{402})$, —$B(Q_{401})(Q_{402})$, —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 may each indicate a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$(s) in two or more of $L_{401}$(s) may optionally be linked to each other via $T_{402}$, which is a linking group, and two ring $A_{402}$(s) may be optionally be linked to each other via $T_{403}$, which is a linking group (see Compounds PD1 to PD4 and PD7). $T_{402}$ and $T_{403}$ may each be the same as described in connection with $T_{401}$.

$L_{402}$ in Formula 401 may be an organic ligand. For example, $L_{402}$ may include a halogen group, a diketone group (e.g., an acetylacetonate group), a carboxylic acid group (e.g., a picolinate group), —C(=O), an isonitrile group, a —CN group, a phosphorus containing group (e.g., a phosphine group, a phosphite group, etc.), or any combination thereof.

Fluorescent Dopant

The fluorescent dopant may include an amine group-containing compound, a styryl group-containing compound, or any combination thereof.

For example, the fluorescent dopant may include a compound represented by Formula 501:

Formula 501

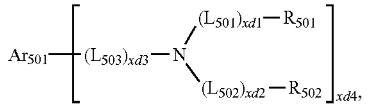

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{601}$ in Formula 501 may be a condensed cyclic group (e.g., an anthracene group, a chrysene group, a pyrene group, etc.) in which three or more monocyclic groups are condensed together.

In one or more embodiments, xd4 in Formula 501 may be 2.

Delayed Fluorescence Material

The emission layer may include a delayed fluorescence material.

In the present specification, the delayed fluorescence material may be selected from compounds capable of emitting delayed fluorescent light based on a delayed fluorescence emission mechanism.

The delayed fluorescence material included in the emission layer may act (e.g., serve) as a host or a dopant depending on the type or kind of other materials included in the emission layer.

In an embodiment, a difference between a triplet energy level (eV) of the delayed fluorescence material and a singlet energy level (eV) of the delayed fluorescence material may be equal to or greater than 0 eV and equal to or less than 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 120 may be improved.

For example, the delayed fluorescence material may include i) a material including at least one electron donor (e.g., a π electron-rich $C_3$-$C_{60}$ cyclic group such as a carbazole group, etc.) and at least one electron acceptor (e.g., a sulfoxide group, a cyano group, a π electron-deficient nitrogen-containing $C_1$-$C_{60}$ cyclic group, etc.), and/or ii) a material including a $C_8$-$C_{60}$ polycyclic group in which two or more cyclic groups are condensed while sharing a boron (B) atom.

Electron Transport Region in Interlayer 123

The electron transport region may have i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, with the constituting layers of each structure being sequentially stacked from the emission layer in the respective stated order.

The electron transport region (e.g., the buffer layer, the hole blocking layer, the electron control layer, and/or the electron transport layer in the electron transport region) may include a metal-free compound including at least one π electron-deficient nitrogen-containing $C_1$-$C_{60}$ cyclic group.

For example, the electron transport region may include a compound represented by Formula 601:

$$[Ar_{601}]_{xe11}\text{-}[(L_{601})_{xe1}\text{-}R_{601}]_{xe21}$$ Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{601})(Q_{602})(Q_{603})$, $—C(=O)(Q_{601})$, $—S(=O)_2(Q_{601})$, or $—P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, or $R_{601}$ may each independently be air electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

Formula 601-1

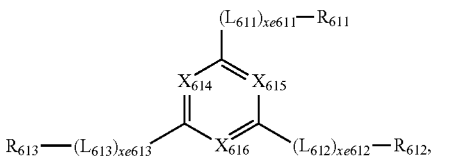

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

A thickness of the electron transport region may be in a range of about 100 Å to about 5,000 Å, for example, about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thicknesses of the buffer layer, the hole blocking layer, the electron control layer, and/or the electron transport layer are within these ranges, satisfactory electron transporting characteristics may be obtained without a substantial increase in driving voltage.

The electron transport region (e.g., the electron transport layer in the electron transport region) may further include, in addition to the above-described materials, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, for example, Compound ET-D1 (LiQ) or ET-D2:

ET-D1

ET-D2

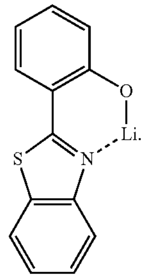

The electron transport region may include an electron injection layer that facilitates the injection of electrons from the second electrode 124. The electron injection layer may directly contact the second electrode 124.

The electron injection layer may have i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (e.g., fluorides, chlorides, bromides, iodides, etc.), or tellurides of the alkali metal, the alkaline earth metal, and the rare earth metal, or any combination thereof.

The alkali metal-containing compound may include one or more alkali metal oxides, such as $Li_2O$, $Cs_2O$, and/or $K_2O$, alkali metal halides, such as LiF, NaF, CsF, KF, LiI, NaI, CsI, and/or KI, or any combination thereof. The alkaline earth metal-containing compound may include an alkaline earth metal oxide, such as BaO, SrO, CaO, $Ba_xSr_{1-x}O$ (wherein xis a real number satisfying the condition of $0<x<1$), and/or $Ba_xCa_{1-x}O$ (wherein x is a real number satisfying the condition of $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and/or the like.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (e.g., the compound represented by Formula 601).

In an embodiment, the electron injection layer may include (e.g., consist of)

i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof.

For example, the electron injection layer may be a KI:Yb co-deposited layer, a RbI:Yb co-deposited layer, a LiF:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be uniformly or non-uniformly dispersed in a matrix including the organic material.

A thickness of the electron injection layer may be in a range of about 1 Å to about 100 Å, for example, about 3 Å to about 90 Å. When the thickness of the electron injection layer is within these ranges, satisfactory electron injection characteristics may be obtained without a substantial increase in driving voltage.

Second Electrode 124

The second electrode 124 is located on the interlayer 123 having a structure as described above. The second electrode 124 may be a cathode, which is an electron injection electrode, and a material for forming the second electrode 124 may be a metal, an alloy, an electrically conductive compound, or any combination thereof, each having a low-work function.

The second electrode 124 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 124 may be a transmissive electrode, a semi-transmissive electrode, or a reflective electrode.

The second electrode 124 may have a single-layered structure or a multi-layered structure including two or more layers.

Capping Layer

A first capping layer may be located outside the first electrode 122 (e.g., on the side of the first electrode 122 facing oppositely away from the second electrode 124), and/or a second capping layer may be located outside the second electrode 124 (e.g., on the side of the second electrode 124 facing oppositely away from the first electrode 122). In one or more embodiments, the light-emitting device 120 may have a structure in which the first capping layer, the first electrode 122, the interlayer 123, and the second electrode 124 are sequentially stacked in this stated order, a structure in which the first electrode 122, the interlayer 123, the second electrode 124, and the second capping layer are sequentially stacked in this stated order, or a structure in which the first capping layer, the first electrode 122, the interlayer 123, the second electrode 124, and the second capping layer are sequentially stacked in this stated order.

Light generated in an emission layer of the interlayer 123 of the light-emitting device 120 may be extracted toward the outside through the first electrode 122, which is a semi-transmissive electrode or a transmissive electrode, and the first capping layer, and/or light generated in an emission layer of the interlayer 123 of the light-emitting device 120 may be extracted toward the outside through the second electrode 124, which is a semi-transmissive electrode or a transmissive electrode, and the second capping layer.

The first capping layer and the second capping layer may increase external luminescence efficiency according to the principle of constructive interference. Accordingly, the light extraction efficiency of the light-emitting device 120 is increased, so that the luminescence efficiency of the light-emitting device 120 may be improved.

Each of the first capping layer and the second capping layer may include a material having a refractive index of 1.6 or more (at a wavelength of 589 nm).

The first capping layer and the second capping layer may each independently be an organic capping layer including an organic material, an inorganic capping layer including an inorganic material, or a composite capping layer including an organic material and an inorganic material.

At least one of the first capping layer or the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent containing O, N, S, Se, Si, F, Cl, Br, I, or any combination thereof. In one or more embodiments, at least one of the first capping layer or the second capping layer may each independently include an amine group-containing compound.

For example, at least one of the first capping layer or the second capping layer may each independently include the compound represented by Formula 201, the compound represented by Formula 202, or any combination thereof.

Manufacturing Method

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the vacuum deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

When layers constituting the hole transport region, the emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed and the structure of a layer to be formed.

Definition of Terms

The term "$C_3$-$C_{60}$ carbocyclic group" as used herein refers to a cyclic group consisting of only carbon atoms as a ring-forming atom and having three to sixty carbon atoms, and the term "$C_1$-$C_{60}$ heterocyclic group" as used herein refers to a cyclic group that has, in addition to one to sixty carbon atoms, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group may have 3 to 61 ring-forming atoms.

The term "cyclic group" as used herein may include both (e.g., simultaneously) the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has 3 to 60 carbon atoms and does not include *—N=*' as a ring-forming moiety, and the term "π electron-deficient nitrogen-containing $C_1$-$C_{60}$ cyclic group" as used herein refers to a heterocyclic group that has 1 to 60 carbon atoms and includes *—N=*' as a ring-forming moiety.

For example, the $C_3$-$C_{60}$ carbocyclic group may be i) a T1 group or ii) a group in which two or more T1 groups are condensed with each other (e.g., the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), and the $C_1$-$C_{60}$ heterocyclic group may be i) a T2 group, ii) a condensed cyclic group in which two or more T2 groups are condensed with each other, or iii) a condensed cyclic group in which at least one T2 group is condensed with at least one T1 group (e.g., the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.).

The π electron-rich $C_3$-$C_{60}$ cyclic group may be i) a T1 group, ii) a condensed cyclic group in which two or more T1 groups are condensed with each other, iii) a T3 group, iv) a condensed cyclic group in which two or more T3 groups are condensed with each other, or v) a condensed cyclic group in which at least one T3 group is condensed with at least one T1 group (e.g., the π electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), and the π electron-deficient nitrogen-containing $C_1$-$C_{60}$ cyclic group may be i) a T4 group, ii) a group in which two or more T4 groups are condensed with each other, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed with each other (e.g., the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group" as used herein each refer to a group condensed to any cyclic group, a monovalent group, or a polyvalent group (e.g., a divalent group, a trivalent group, a tetravalent group, etc.) according to the structure of a formula for which the corresponding term is used. For example, a "benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group that has 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, and/or the like. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at a terminal end (e.g., the terminus) of the $C_2$-$C_{60}$ alkyl group, and examples thereof may include an ethenyl group, a propenyl group, a butenyl group, and/or the like. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at a terminal end (e.g., the terminus) of the $C_2$-$C_{60}$ alkyl group, and examples thereof may include an ethynyl group, a propynyl group, and/or the like. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, an isopropyloxy group, and the like.

The term "$C_3$-$C_{10}$ cycloalkyl group" as used herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or a bicyclo [2.2.1]heptyl group), a bicyclo[1.1.1]pentyl group, a bicyclo [2.1.1]hexyl group, a bicyclo[2.2.2]octyl group, and/or the like. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent saturated monocyclic group that further includes, in addition to 1 to 10 carbon atoms, at least one heteroatom as a ring-forming atom, and examples thereof may include a 1,2,3,4-oxatriazolidinyl group, a tetrahydrofuranyl group, a tetrahydrothiophenyl group, and/or the like. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and examples thereof may include a cyclopentenyl group, a cyclohexenyl group, a cycloheptenyl group, and/or the like. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group that includes, in addition to 1 to 10 carbon atoms, at least one heteroatom as a ring-forming atom and has at least one double bond in its ring. Examples of the $C_1$-$C_{10}$ heterocycloalkenyl group may include a 4,5-dihydro-1,2,3,4-oxatriazolylgroup, a 2,3-dihydrofuranyl group, a 2,3-dihydrothiophenyl group, and/or the like. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system of 6 to 60 carbon atoms, and the term "$C_6$-$C_{60}$ arylene group" as used herein refers to a divalent group having a carbocyclic aromatic system of 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and/or the like. When the $C_6$-$C_{60}$ aryl group and the $C_6$-$C_{60}$ arylene group each include two or more rings, the two or more rings may be condensed with each other.

The term "$C_1$-$C_{60}$ heteroaryl group" as used herein refers to a monovalent group having a heterocyclic aromatic system that has, in addition to 1 to 60 carbon atoms, at least one heteroatom as a ring-forming atom. The term "$C_1$-$C_{60}$ heteroarylene group" as used herein refers to a divalent group having a heterocyclic aromatic system that has, in addition to 1 to 60 carbon atoms, at least one heteroatom as a ring-forming atom. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, a carbazolyl group, a dibenzofuranyl group, a dibenzothiofuranyl group, and/or the like. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group having two or more rings condensed with each other, only carbon atoms (e.g., having 8 to 60 carbon atoms) as ring-forming atoms, and no aromaticity in its entire molecular structure (e.g., is not aromatic when considered as a whole). Examples of the monovalent non-aromatic condensed polycyclic group may include an indenyl group, a fluorenyl group, a spiro-bifluorenyl group, a benzofluorenyl group, an indenophenanthrenyl group, an indenoanthracenyl group, an adamantyl group, and/or the like. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group having two or more rings condensed with each other, at least one heteroatom in addition to 1 to 60 carbon atoms, as ring-forming atoms, and no aromaticity in its entire molecular structure (e.g., is not aromatic when considered as a whole). Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, a benzothienodibenzothiophenyl group, an azaadamantyl group, and/or the like. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$C_7$-$C_{60}$ arylalkyl group" as used herein refers to a monovalent group represented by -$A_{104}A_{105}$ (wherein $A_{104}$ is a $C_1$-$C_{54}$ alkylene group, and $A_{105}$ is a $C_6$-$C_{59}$ aryl group), and the term "$C_2$-$C_{60}$ heteroarylalkyl group" as used herein refers to a monovalent group represented by -$A_{106}A_{107}$ (wherein $A_{106}$ is a $C_1$-$C_{59}$ alkylene group, and $A_{107}$ is a $C_1$-$C_{59}$ heteroaryl group).

The term "$R_{10a}$" as used herein refers to:

- deuterium, —F, —Cl, —Br, —I, a hydroxyl group, a cyano group, or a nitro group;
- a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;
- a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or
- —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.
- $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom may include O, S, N, P, Si, B, Ge, Se, or any combination thereof.

The term "the third-row transition metal" as used herein includes hafnium (Hf), tantalum (Ta), tungsten (W), rhenium (Re), osmium (Os), iridium (Ir), platinum (Pt), gold (Au), and/or the like.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group." In other words, the "terphenyl group" is a substituted phenyl group having, as a substituent, a $C_6$-$C_{60}$ aryl group substituted with a $C_6$-$C_{60}$ aryl group.

The maximum number of carbon atoms in the substituent definition is provided as an example. For example, the maximum carbon number of 60 in a $C_1$-$C_{60}$ alkyl group is an example, and the definition of the alkyl group equally applies to a $C_1$-$C_{20}$ alkyl group. The other cases may be the same.

* and *' as used herein, unless defined otherwise, each refer to a binding site to a neighboring atom in a corresponding formula.

Hereinafter, manufacture of a display apparatus according to an embodiment and evaluation results thereof will be described with reference to Examples.

Example 1: Preparation of Scattering Particle

Al was deposited on a $TiO_2$ particle having a diameter of 150 nm to form a first layer having a thickness of 20 nm. The Al-coated $TiO_2$ particle was impregnated in propanethiol in an Ar atmosphere at room temperature for 1 hour, and then filtered to form a second layer in which propanethiol was bonded as a ligand to Al, which was the first layer.

Example 2: Preparation of Green Quantum Dot Ink Composition 100 parts of 1,6-hexanedilo diacrylate as a monomer, 100 parts of Ag—In—Ga—S for green quantum dot based on 100 parts of the monomer, 10 parts of $TiO_2$ scattering particle of Example 1 based on 100 parts of the monomer, 0.1 parts of TPO initiator based on 100 parts of the monomer, and 2 parts of dispersant (—$[CH_2$—$CH(COONa)$—$]_m$/molecular weight in a range of 500 to 15,000) based on 100 parts of the monomer were mixed to prepare a green quantum dot ink composition.

Example 3: Preparation of Red Quantum Dot Ink Composition 100 parts of 1,6-hexanedilo diacrylate as a monomer, 100 parts of Ag—In—Ga—S for red quantum dot based on 100 parts of the monomer, 10 parts of $TiO_2$ scattering particle of Example 1 based on 100 parts of the monomer, 0.1 parts of TPO initiator based on 100 parts of the monomer, and 2 parts of dispersant (—$[CH_2$—$CH(COONa)$—$]_m$/molecular weight in a range of 500 to 15,000) based on 100 parts of the monomer were mixed to prepare a red quantum dot ink composition.

The Ag—In—Ga—S for green quantum dot and the Ag—In—Ga—S for red quantum dot have the same components but different core sizes.

Comparative Example 1: Preparation of Green Quantum Dot Ink Composition

A green quantum dot ink composition was prepared in substantially the same manner as in Example 2, except that an uncoated $TiO_2$ scattering particle (150 nm) was utilized instead of the scattering particle of Example 1.

Comparative Example 2: Preparation of Red Quantum Dot Ink Composition

A red quantum dot ink composition was prepared in substantially the same manner as in Example 3, except that an uncoated $TiO_2$ scattering particle (150 nm) was utilized instead of the scattering particle of Example 1.

Preparation of Scatterer Ink Composition 100 parts of 1,6-hexanedilo diacrylate as a monomer, 20 parts (150 nm) of uncoated $TiO_2$ scattering particle based on 100 parts of the monomer, 0.1 parts of TPO initiator based on 100 parts of the monomer, and 2 parts of dispersant ($—[CH_2—CH(COONa)—]_m$/molecular weight in a range of 500 to 15,000) based on 100 parts of the monomer were mixed to prepare a scatterer ink composition.

Example 4

First, as shown in FIG. 3A, the light-emitting device 120 was formed on the first substrate 110, and then was covered by the thin-film encapsulation layer 130. As the emission layer included in the interlayer 123 of the light-emitting device 120, a blue emission layer was formed as a common layer.

Next, as shown in FIG. 3B, the color filter layers 220R, 220G, and 220B were formed on the second substrate 210 at positions corresponding to the light-emitting device 120, and a partial region, in which the color filter layer 220R, the color filter layer 220G, and the color filter layer 220B overlapped, functioned as a black matrix.

Next, as shown in FIG. 3C, a hollow silica material was utilized on the color filter layers 220R, 220G, and 220B to form the low refractive index layer 260 on the color filter layers 220R, 220G, and 220B. Next, on the low refractive index layer 260, the bank 240 was patterned on a region in which the color filter layers 220R, 220G, and 220B overlapped such that the bank 240 remained for each position between the color filter layers 220R, 220G, and 220B between each pixel.

Thereafter, as shown in FIG. 3D, the quantum dot layer 230R was formed in the red pixel by utilizing the red quantum dot ink composition of Example 3 by an inkjet process, and the quantum dot layer 230G was formed in the green pixel by utilizing the green quantum dot ink composition of Example 2 by an inkjet process. The scattering layer 230W was formed in the blue pixel by utilizing the scatterer ink composition.

The quantum dot layer 230R, the quantum dot layer 230G, and the scattering layer 230W formed by inkjetting (e.g., the inkjet process) were irradiated with UV light (at a wavelength of 365 nm) for 4 seconds to cure the quantum dot layer 230R, the quantum dot layer 230G, and the scattering layer 230W. Next, the quantum dot layer 230R, the quantum dot layer 230G, and the scattering layer 230W were post-baked at a temperature of 100° C. for 10 minutes in an atmospheric atmosphere.

Next, silicon nitride was vapor-deposited to form the inorganic capping layer 270 having a thickness of 4,000 Å.

Next, as shown in FIG. 3E, the filling material 300 was applied between the first and second substrates 110 and 210, and the first and second substrates 110 and 210 were bonded together, thereby completing the manufacture of a display apparatus.

Comparative Example 3

A display apparatus was manufactured in substantially the same manner as in Example 4, except that the quantum dot layer 230R was formed in the red pixel by utilizing the red quantum dot ink composition of Comparative Example 2 by an inkjet process, and the quantum dot layer 230G was formed in the green pixel by utilizing the green quantum dot ink composition of Comparative Example 1 by an inkjet process.

The efficiency of each of the display apparatuses of Example 4 and Comparative Example 3 was measured, and the measured values were compared with each other. Results thereof are shown in Table 1. The efficiency was measured utilizing a measurement apparatus $C_{9920}$-2-12 manufactured by Hamamatsu Photonics.

TABLE 1

| | Efficiency (%) |
|---|---|
| Comparative Example 3 | 77.8[1)] |
| Example 4 | 89.0 |

[1)]The efficiency of Comparative Example 3 is a value based on an ideal device in which a quantum dot layer is formed by curing a quantum dot composition in an ideal state in the absence of oxygen and moisture, followed by addition of a capping layer. The ideal device has efficiency of 100%.

Referring to Table 1, it was confirmed that the display apparatus of Example 4 showed higher efficiency than the display apparatus of Comparative Example 3. This is because, although the display apparatuses of Example 4 and Comparative Example 3 both underwent a post-baking process in an atmospheric atmosphere after being cured, in the quantum dot layers of the display apparatus of Example 4, a quantum dot was (e.g., could be) protected from the attack of oxygen and/or moisture due to the scattering particles including the first layer including a compound capable of reacting with oxygen and/or moisture, whereas in the quantum dot layers of the display apparatus of Comparative Example 3, due to the inclusion of only a common scattering particle, a quantum dot defect occurred due to the attack of oxygen and/or moisture.

For example, in the quantum dot layers of the display apparatus of Example 4, after the propanethiol ligand, which was the second layer of the shell of the scattering particle, was removed (e.g., peeled off) in the post-baking process, Al, which was the first layer that finally remained, became an oxide of Al due to the attack of oxygen and/or moisture, and thus, the quantum dot could be protected from the attack of oxygen and/or moisture. That is, in the quantum dot layers of the display apparatus of Example 4, because Al reacted with oxygen and/or moisture before the quantum dot did, there was less or no oxygen and/or moisture left to attack the quantum dot, and therefore the quantum dot was protected from the attack of oxygen and/or moisture.

According to the one or more embodiments, a quantum dot included in a quantum dot layer of a display apparatus may be protected from permeation of oxygen and moisture, and thus, the display apparatus may have improved efficiency.

The use of “may” when describing embodiments refers to “one or more embodiments of the present disclosure.”

In the present specification, when particles are spherical, “diameter” indicates a particle diameter, e.g., an average particle diameter, and when the particles are non-spherical, the “diameter” indicates a major axis length, e.g., an average major axis length.

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, or 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic apparatus, the display device, and/or any other relevant devices or components according to embodiments of the present invention described herein may be implemented utilizing any suitable hardware, firmware (e.g. an application-specific integrated circuit), software, or any combination of software, firmware, and hardware. For example, the various components of the device may be formed on one integrated circuit (IC) chip or on separate IC chips. Further, the various components of the device may be implemented on a flexible printed circuit film, a tape carrier package (TCP), or a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A scattering particle comprising:
a core, and
a shell,
wherein the shell comprises:
a first layer comprising a first compound capable of reacting with oxygen and/or moisture; and
a second layer comprising a second compound decomposable by light and/or heat.

2. The scattering particle of claim 1, wherein the first layer is between the core and the second layer.

3. The scattering particle of claim 1, wherein the second layer comprises a second-first layer comprising a compound decomposable by light and/or a second-second layer comprising a compound decomposable by heat.

4. The scattering particle of claim 1, wherein the first compound comprises a metal, a phenol-based compound, a phosphorus-based compound, a sulfur-based compound, or any combination thereof.

5. The scattering particle of claim 1, wherein the first compound comprises an alkali metal, an alkaline earth metal, a Group III metal, ethylenebis(oxyethylene)bis-(3-(5-tert-butyl-4-hydroxy-m-tolyl)propionate), 3,9-bis[2-[3-(3-t-butyl-4-hydroxy-5-methylphenyl)propionyloxy]-1,1-dimethylethoxy]-2,4,8,10-tetraoxaspiro[5.5]undecane, pentaerythrityl tetrakis[3-(3,5-di-t-butyl-4-hydroxyphenyl) propionate], 1,3,5,-trimethyl-2,4,6,-tris(3'5'-di-t-butyl-4-hydroxybenzyl)benzene, triethyleneglycol-bis[3-(3-t-butyl-5-methyl-4-hydroxyphenyl)propionate], 4,4'-thiobis(6-t-butyl-3-methylphenol), tris-(3,5-di-t-butyl-4-hydroxybenzyl)-isocyanurate, 1,3,5-tris(4-t-butyl-3-hydroxy-2,6-dimethylbenzyl)-isocyanurate, 1,6-hexanediol-bis[3-(3,5-di-t-butyl-4-hydroxyphenyl)propionate], 2,2-thio-diethylenebis[3-(3,5-di-t-butyl-4-hydroxyphenyl) propionate], N,N'-hexamethylenebis(3,5-di-t-butyl-4-hydroxy-hydrocinnamamide), 1,3,5-trimethyl-2,4,6-tris(3,5-di-t-butyl-4-hydroxybenzyl)benzene, 2,4-bis[(octylthio) methyl]-O-cresol, 1,6-hexanediol-bis-[3-(3,5-di-t-butyl-4-hydroxyphenyl)propionate], octadecyl-[3-(3,5-di-t-butyl-4-hydroxyphenyl)propionate], 2,2'-methylenebis(4-methyl-6-t-butylphenol), 4,4'-butylidene-bis(3-methyl-6-t-butylphenol), 1,1,3-tris(2-methyl-4-hydroxy-5-t-butylphenyl)butane, 1,3,5-tris(4-hydroxybenzyl)benzene, tetrakis[methylene-3-(3,5'-di-t-butyl-4'-hydroxyphenylpropionate)]methane, sodium hydrogen sulfite, sodium sulfite, 2,2-bis({[3-(dodecylthio)propionyl]oxy}methyl)-1,3-propanediyl-bis[3-(dodecylthio)propionate], 2-mercaptobenzimidazole, dilauryl-3,3'-thiodipropionate, dimyristyl-3,3'-thiodipropionate, distearyl-3,3'-thiodipropionate, pentaerythrityl-tetrakis(3-laurylthiopropionate), 3,9-bis(2,6-di-tert-butyl-4-methylphenoxy)-2,4,8,10-tetraoxa-3,9-diphosphaspiro[5.5]undecane, diisodecyl pentaerythritol diphosphite, bis(2,4-di-t-butylphenyl)pentaerythritol diphosphite, 2,2'-methylenebis(4,6-di-t-butyl-1-phenyloxy) (2-ethylhexyloxy)phosphorus, 6-[3-(3-t-butyl-4-hydroxy-5-methylphenyl)propoxy]-2,4,8,10-tetra-t-butyldibenz[d,f][1,3,2]dioxaphospepine, triphenyl phosphite, diphenyl isodecyl phosphite, phenyl diisodecyl phosphite, 4,4'-butylidene-bis (3-methyl-6-t-butylphenylditridecyl)phosphite, octadecyl phosphite, tris(nonylphenyl)phosphite, 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, 10-decyloxy-9,10-dihydro-9-oxa-10-phosphaphenanthrene-10-oxide, tris(2,4-di-t- butylphenyl)phosphite, cyclic neopentanetetraylbis(2,4-di-t-butylphenyl)phosphite, cyclic neopentanetetraylbis(2,6-di-t-butylphenyl)phosphite, 2,2-methylenebis(4,6-di-t-butylphenyl)octylphosphite, tris(2,4-di-t-butylphenyl) phosphite, tetrakis(2,4-di-t-butylphenyl)[1,1-biphenyl]-4, 4'diylbisphosphonite, bis[2,4-bis(1,1-dimethylethyl)-6-methylphenyl]ethyl ester, phosphonic acid, or any combination thereof.

6. The scattering particle of claim 1, wherein the second compound is decomposable by light having a wavelength of 500 nm or less and/or by heat at a temperature of 80° C. or higher.

7. The scattering particle of claim 1, wherein the second compound comprises a phosphine-based ligand, an amine-based ligand, a thiol-based ligand, a polyolefin-based compound, a compound comprising a photosensitive functional group, or any combination thereof.

8. The scattering particle of claim 1, wherein the core comprises $Al_2O_3$, $SiO_2$, ZnO, $ZrO_2$, $BaTiO_3$, $TiO_2$, $Ta_2O_5$, $Ti_3O_5$, ZnO—Al, $Nb_2O_3$, SnO, MgO, or any combination thereof.

9. An ink composition comprising:

a quantum dot, the scattering particle of claim 1, and a monomer.

10. The ink composition of claim 9, wherein the quantum dot comprises a core-shell structure comprising:

a core comprising a semiconductor compound; and a shell comprising an oxide of metal, an oxide of metalloid, an oxide of non-metal, a semiconductor compound, or any combination thereof.

11. The ink composition of claim 10, wherein the semiconductor compound comprised in the core comprises a Group I-III-VI semiconductor compound.

12. The ink composition of claim 11, wherein the Group I-III-VI semiconductor compound comprises AgInS, $AgInS_2$, CuInS, $CuInS_2$, $CuGaO_2$, $AgGaO_2$, $AgAlO_2$, AgInGaS, or any combination thereof.

13. The ink composition of claim 10, wherein the semiconductor compound comprised in the shell comprises CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

14. The ink composition of claim 9, wherein the quantum dot is about 1 wt % to about 70 wt % in amount, based on total 100 wt % of the ink composition, and the scattering particle is about 0.1 wt % to about 10 wt % in amount, based on total 100 wt % of the ink composition.

15. A display apparatus comprising:

a first substrate, a light-emitting device on the first substrate; and a light controller on the first substrate and corresponding to the light-emitting device, wherein the light controller comprises a quantum dot layer and a color filter layer, and the quantum dot layer is prepared by utilizing the ink composition of claim 9.

16. The display apparatus of claim 15, wherein the light-emitting device comprises:

a first electrode;

a second electrode facing the first electrode; and an interlayer between the first electrode and the second electrode and comprising an emission layer.

17. The display apparatus of claim 16, wherein the interlayer further comprises:

a hole transport region comprising a hole injection layer, a hole transport layer, an emission auxiliary layer, an electron blocking layer, or any combination thereof; and/or an electron transport region comprising a hole blocking layer, an electron transport layer, an electron injection layer, or any combination thereof.

18. The display apparatus of claim 15, wherein the scattering particle comprises a core and a shell, and the shell comprises a compound obtained by oxidizing the first.

19. The display apparatus of claim 18, wherein the compound obtained by oxidizing the first compound is a metal oxide.

20. The display apparatus of claim 15, further comprising an inorganic capping layer.

* * * * *